United States Patent
Adem et al.

(10) Patent No.: US 6,770,559 B1
(45) Date of Patent: Aug. 3, 2004

(54) METHOD OF FORMING WIRING BY IMPLANTATION OF SEED LAYER MATERIAL

(75) Inventors: Ercan Adem, Sunnyvale, CA (US); Fei Wang, San Jose, CA (US); Joffre F. Bernard, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/282,558

(22) Filed: Oct. 29, 2002

(51) Int. Cl.[7] .......................................... H01L 21/4763
(52) U.S. Cl. ...................... 438/637; 438/627; 438/597; 438/653; 438/677; 438/687
(58) Field of Search ................... 438/597, 627, 438/637, 641, 653, 675, 677, 687, 927

(56) References Cited

U.S. PATENT DOCUMENTS 6,376,370 B1 * 4/2002 Farrar ........................ 438/678
2003/0155247 A1 * 8/2003 Miura et al. ................ 205/157

* cited by examiner

*Primary Examiner*—Beth E. Owens
(74) *Attorney, Agent, or Firm*—Foley & Lardner LLP

(57) ABSTRACT

A conductive element of an integrated circuit wiring network is formed by a plating process. A seed layer for the conductive material is grown on the sidewalls and bottom surface of a trench using a low energy ion implantation process. The implantation is performed at an angle to the substrate to achieve coverage of the trench sidewalls. The resulting seed layer avoids constricting or closing the opening of the trench and has an approximately uniform thickness.

33 Claims, 5 Drawing Sheets

METHOD OF FORMING WIRING BY IMPLANTATION OF SEED LAYER MATERIAL

BACKGROUND OF THE INVENTION

1. Field of the Invention

The invention relates to the formation of back end wiring networks for integrated circuits, and particularly to wiring formed by electroplating processes.

2. Related Technology

Semiconductor devices such as integrated circuits (ICs) may include millions of devices, such as metal oxide semiconductor field effect transistors (MOSFETs) and complementary MOSFET (CMOS) circuits. These devices are connected to form circuits through complex back end wiring networks. The typical wiring network is comprised of multiple levels of metal wiring that are inlaid in an insulating material. The individual wires are typically formed by damascene processing. In damascene processing, trenches that define the paths of each wire are formed in a layer of an insulating material such as silicon oxide or a low-k organic insulator. A layer of metal is formed to fill the trenches and cover the surface of the insulator, and then the overburden portion of the metal is polished away, leaving in place only that metal that fills the trenches. Another layer of insulating material is then formed over the metal filled trenches, and another level of wiring is formed in the new layer of insulating material. Vertical conductive structures known as plugs or studs are also formed to connect wiring of different levels and to connect the wiring to contact points of circuit devices. Plugs may be formed in intermediate steps between formation of wiring, or may be formed concurrently with the formation of wiring by dual damascene processing.

Despite the ability of conventional processes to fabricate millions of devices on an IC, there is still a need to decrease the size of IC device features so as to improve the performance of the individual devices, as well as to increase the number of devices on a single IC. The need to decrease device size and increase device speed has led to the adoption of high conductivity metals such as copper for the back end wiring networks of integrated circuits. Electroplating and electroless plating processes have been adopted as the preferred methods of depositing bulk copper in wiring trenches during damascene processing. However, copper does not plate well on conventional insulating materials such as silicon oxide, nor on most of the conductive barrier materials that must be used in copper wiring trenches to prevent diffusion of copper ions into the surrounding insulating material. Therefore, in conventional copper processing, the deposition of bulk copper by a plating processes is preceded by the formation of a thin copper seed layer over the substrate through a process such as physical vapor deposition (PVD). The seed layer is then used as a base layer during subsequent plating.

A typical copper plating process for forming an inlaid (damascene) conductive element is shown in FIGS. 1a–1c. FIG. 1a shows a substrate comprising an upper layer of an interlevel dielectric 10 such as silicon oxide. The silicon oxide 10 has formed therein a wiring trench (or a via) 12 that is to be filled with copper. The surface of the interlevel dielectric 10 is covered with a layer of a barrier material 14 such as TaN that prevents diffusion of copper into the interlevel dielectric 10. FIG. 1b shows the structure of FIG. 1a after formation of a thin copper seed layer 16 by a physical vapor deposition (PVD) process. FIG. 1c shows the structure of FIG. 1b after formation of bulk copper 18 by electroplating or electroless plating. An overburden portion of the bulk copper and other layers on the upper surface of the interlevel dielectric 10 is then removed to leave a copper conductive element inlaid in the trench.

The structure shown in FIG. 1c is idealized, in that it shows that the bulk copper formed in the trench is void-free. However, achieving void-free bulk copper deposition has become more difficult as the result of the continued miniaturization of IC device features. In particular, as the sizes of the IC device features are shrinking, the typical aspect ratios (i.e. ratio of depth to width) of trenches such as those illustrated in FIG. 3c are increasing, which presents problems for conventional seed layer formation.

One significant problem encountered in seed layer formation is illustrated in FIGS. 2a–2b. As shown in FIG. 1b, the seed layer formed by physical vapor deposition is thick on the bottom of the trench and on the top surface of the substrate, but is relatively thin on the sidewalls. Thin sidewalls may result in the formation of voids during a subsequent plating process because the solution in which the substrate is immersed during plating is capable of dissolving copper and may therefore etch through thin portions of the copper seed layer. As shown in FIG. 2a, this may result in the creation of discontinuities 20 in the copper seed layer. Such discontinuities prevent the local formation of copper during the remainder of the plating process. Thus, as shown in FIG. 2b, the discontinuities develop into voids 22 in the bulk copper 18. Such voids increase the resistivity of the copper wiring and may eventually result in circuit failure.

One approach to avoiding the aforementioned problem is to increase the thickness of the seed layer along the sidewalls so that the seed layer will endure the etching that occurs at the beginning of the plating process. However, because the materials deposited by physical vapor deposition processes travel in a generally vertical direction toward the substrate, the amount of seed layer material that is deposited on the vertical sidewalls is relatively small in comparison to the amount of seed layer material deposited on the horizontal surfaces of the substrate and the trench bottom. As a result, the deposited material tends to grow inward more quickly in the areas around the top corners of the trench sidewalls than at the lower portions of the trench sidewalls. This produces a pinching effect, as shown in FIG. 3, that can seal or severely constrict the trench opening if too much material is deposited.

Therefore, continued reduction of device dimensions will require new methods for creating copper wiring that can produce reliable void-free copper wiring elements in trenches and vias that have high aspect ratios.

SUMMARY OF THE INVENTION

To address the problems described above, the present invention contemplates a process for depositing void-free, reliable copper or copper-based alloys, or other metal alloys that requires a seed layer to facilitate effective electroplating.

The present invention also provides a method of forming a seed layer in a narrow trench without forming an excessive thickness of seed layer material at upper portions of the trench that could lead to constriction or sealing of the trench opening.

In accordance with embodiments of the invention, a seed layer is formed in a wiring trench through ultra-low energy implantation of the seed layer material in the sidewalls and bottom surface of a trench. The implantation is performed at an angle to the substrate so as to provide sufficient direct implantation of the trench sidewalls. The implantation causes a buildup of seed layer material on the trench sidewalls in a manner that provides essentially continuous and uniform sidewall coverage. Problems of the conventional processing such as void formation and constriction or sealing of the trench by seed layer material are therefore reduced or eliminated.

In accordance with one embodiment of the invention, a wiring for an integrated circuit is formed. Initially, a substrate including an interlevel dielectric layer is provided. The interlevel dielectric layer has a trench for the formation of wiring formed therein. The trench is typically lined with a barrier material, which may be provided as a distinct layer or may comprise a portion of the interlevel dielectric layer at the trench wall surfaces that has been doped with one or more diffusion-preventing material. The substrate is then subjected to a low energy ion implantation process to form a seed layer of a conductive material on the barrier layer. The seed material is preferably copper. The low energy implantation process typically involves implanting seed material at an angle to the surface of the substrate while rotating the substrate continuously or among several stationary positions to achieve approximately even coverage of the trench sidewalls and bottom surface. A plating process is then performed to deposit a bulk conductive material in the trench. The bulk conductive material is preferably copper. Further processing such as removal of an overburden portion of the conductor, formation of a passivation layer, and formation of additional wiring may then be performed.

DESCRIPTION OF THE DRAWINGS

Preferred embodiments will hereafter be described with reference to the accompanying drawings, wherein like numerals denote like elements.

DESCRIPTION OF THE PREFERRED EMBODIMENT

A preferred embodiment of the present invention is now described with reference to FIG. 4a to FIG. 4d.

Figure 1A:
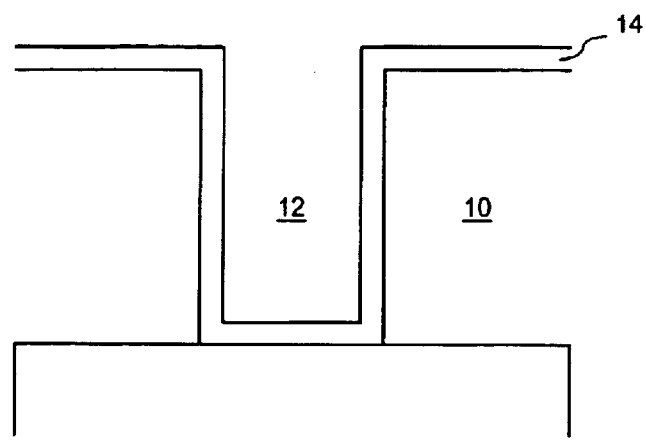
FIGS. 1a–1c show copper plating in accordance with a conventional process.
Figure 1B:
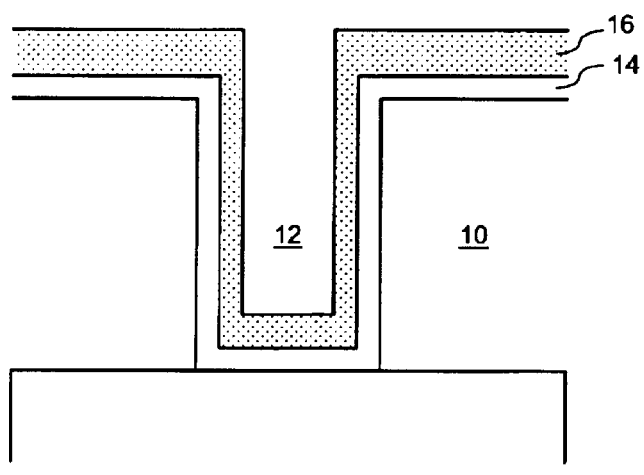
Figure 1C:
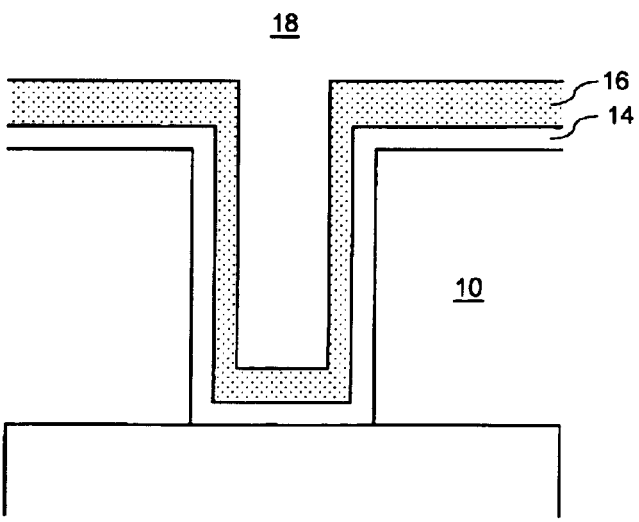
Figure 2A:
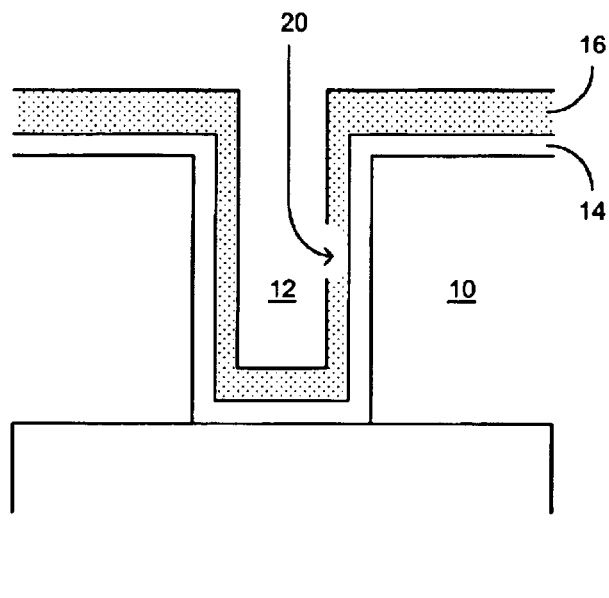
FIGS. 2a–2b show a mechanism resulting in void formation in the conventional copper plating process.
Figure 2B:
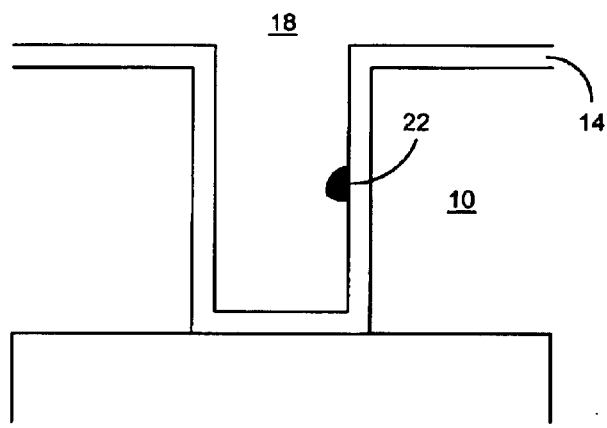
Figure 3:
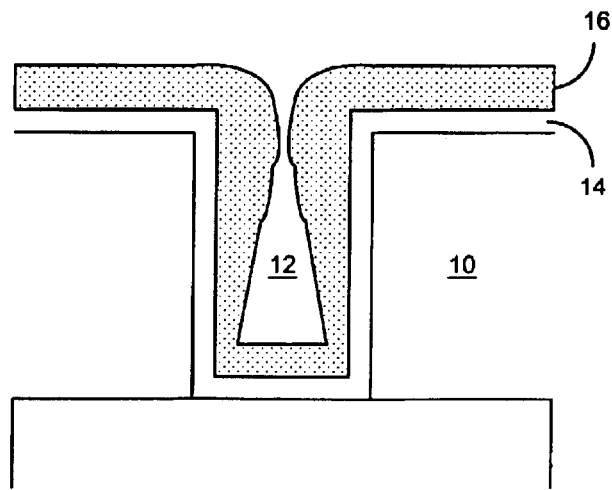
FIG. 3 shows a structure resulting from excessive deposition of seed layer material by physical vapor deposition.
Figure 4A:
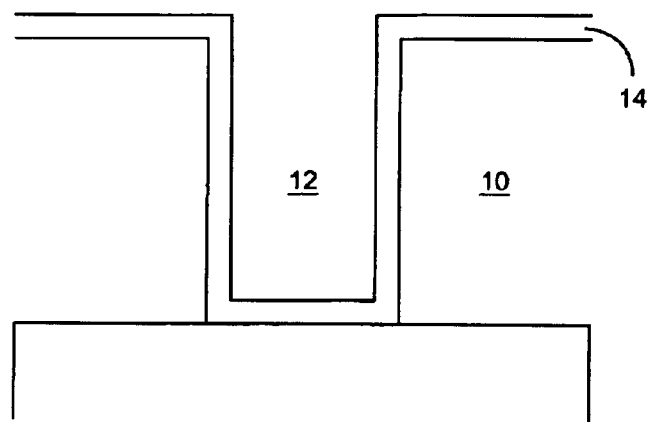
FIGS. 4a–4d show structures formed at successive stages of a copper wiring formation process in accordance with a preferred embodiment of the invention.

FIG. 4a shows a substrate comprised of an upper layer of an interlevel electric 10. A trench 12 is provided in the interlevel dielectric. The trench defines the shape of a conductive element such as a via or an interconnect that is to be formed in the interlevel dielectric. The substrate is covered with a layer 14 of a diffusion barrier material such as TaN (tantalum nitride) or WN (tungsten nitride) for preventing diffusion of copper into the surrounding interlevel dielectric material 12.

Figure 4B:
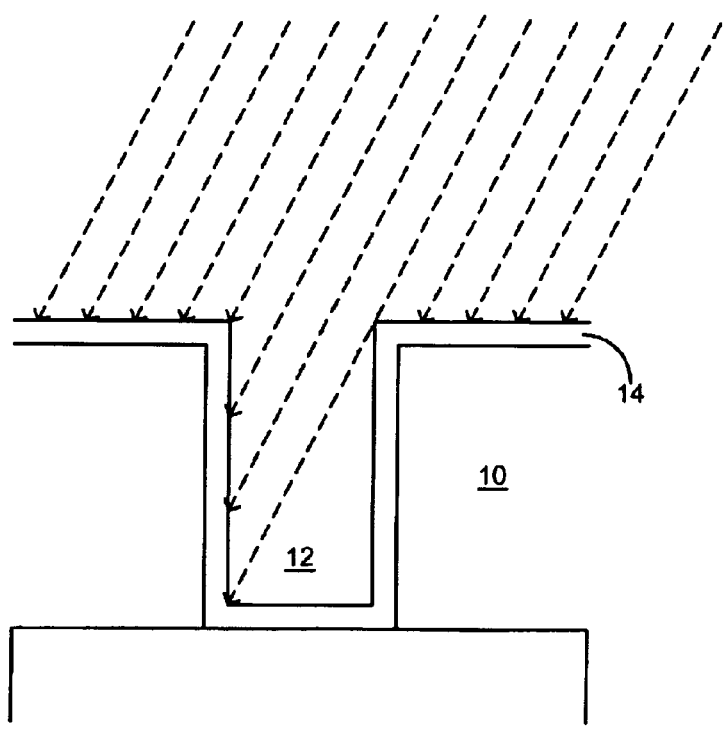

As shown in FIG. 4b, the substrate is subjected to an ultra-low energy ion implantation process in which copper ions, or copper ions along with ions of alloying materials, are implanted into the barrier layer material. In the preferred embodiment the implantation is performed at a non-perpendicular angle with respect to the broad surface of the substrate. The angle is chosen such that sufficient implantation of the sidewalls and the bottom surface of the trench occurs without shadowing of any portion of the trench sidewalls or trench bottom. The implantation is typically performed by an implantation device that provides computer controlled tilting and rotation of the substrate. Preferably the substrate is rotated while tilted with respect to the ion beam to provide uniform exposure of all sidewalls and bottom surfaces to the ion beam. However, in alternative embodiments the substrate may be rotated among several stationary positions and exposed for a given period of time at each position to provide approximately even exposure of all trench surfaces. Depending on the implementation, the angle of implantation may also be changed during implantation.

The implantation process is performed using an ultra-low implantation energy so that minimal ion penetration of the barrier layer by the implanted ions occurs. The implantation is performed for a time that is sufficient to allow the implanted ions to build upon themselves and ultimately converge to form a layer of copper that grows outward from the layer of barrier material. Implantation to a depth of 10 Angstroms or less is desirable so that the growth of the copper seed layer occurs in a timely fashion. Ultra-low energy implantation will allow some ions to adhere to the surface of the barrier layer material rather than penetrating the barrier layer material. Such adhesion is facilitated by maintaining the substrate at a low temperature, such as room temperature or lower. Conventional ion implantation machines provide sufficient control of temperature as well as implantation energy.

The choice of implantation parameters is important for optimizing seed layer growth by the present technique. Factors affecting the choice of implantation energy include the mass of the implanted ions and the density of the barrier material into which the ions are implanted. Typical barrier materials such as TaN and WN are relatively dense. To achieve the desired penetration of such materials, an implantation energy of 250 eV or less is desirable. The implantation energy is limited so that the impact of the ion species against the surface of the barrier layer material does not cause sputtering of the barrier layer material.

A typical implantation dose for building a suitable seed layer is from $10^{15}$ to $10^{18}$ atoms per square centimeter, and depends in part on the average depth of penetration Rd of the ion species. Implantation is continued until the amount of seed material grown on the surface of the barrier layer material is sufficient to survive the etching that will occur at the beginning of a subsequent plating process.

Figure 4C:
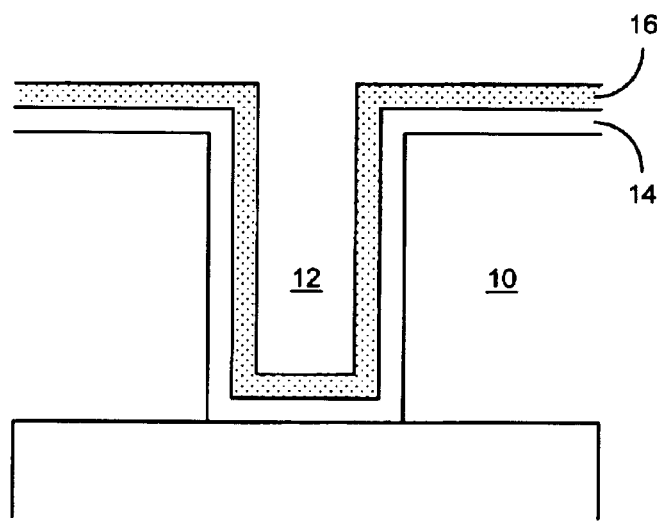

FIG. 4c shows the structure of FIG. 4b after completion of the ultra-low energy ion implantation process. As shown in FIG. 4c, the resulting seed layer 16 has an approximately uniform thickness across both the bottom and sidewall surfaces of the trench, and provides continuous conformal coverage of the trench surfaces.

Figure 4D:
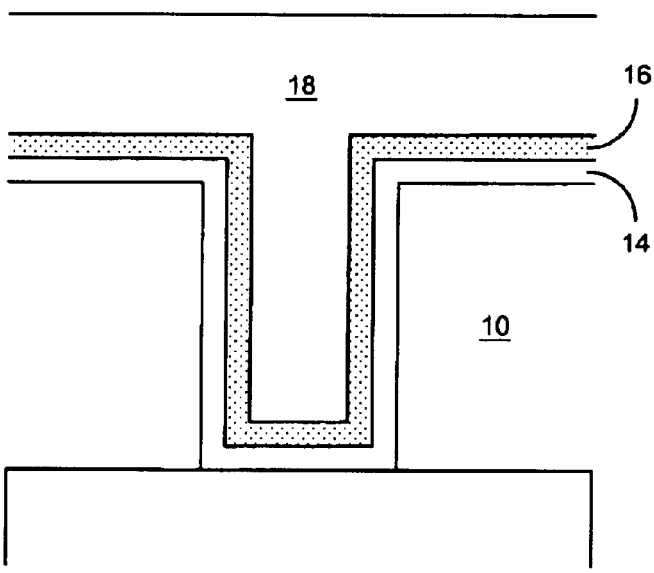

FIG. 4d shows the structure of FIG. 4c after a conventional plating process such as electroplating or electroless plating has been performed to deposit a layer of bulk copper 18 over the substrate and within the trench using the implanted material as a seed layer. The bulk copper within the trench is void-free since the seed layer is continuous throughout the trench.

Further conventional processing tasks are then typically performed. For example, the overburden portion of the bulk copper is typically removed, such as by chemical mechanical polishing, to leave an inlaid conductive element in the trench. A passivation layer is then typically formed over the surface of the substrate, or selectively deposited on the exposed copper surfaces. Further processing may then be performed, such as the formation of one or more additional layers of interlevel dielectric containing further wiring.

Those of ordinary skill will recognize that a variety of alternatives to the processing of FIGS. 4a–4d may be implemented. For example, while the processing of FIGS. 4a–4d assumes a distinct layer of a barrier material that is deposited conformally over the entire substrate, in one alternative embodiment the barrier layer may be confined to the trench, and remaining portions of the substrate may be separately masked during implantation. In another alternative embodiment, the barrier layer within the trench need not comprise a distinct layer of material, but rather may comprise a surface portion of the interlevel dielectric that has been doped such as by ion implantation with one or more diffusion preventing materials. In addition, while the preferred embodiment of FIGS. 4a–4d illustrates the trench as a single inlay trench, in alternative embodiments seed layer implantation may be performed for dual damascene trenches. Dual damascene trenches typically comprise trenches having vias formed in their bottoms to create spaces for connections to underlying wiring layers. The vias and trenches are typically provided with a common seed layer during a single seed layer formation process, and are typically filled with bulk metal in a single plating process. In other alternatives, vias may be filled by implanting a seed layer material, followed by plating of bulk conductive material. It is further noted that the processing described above may be applied to other metals used for wiring in addition to copper.

Figure 5:
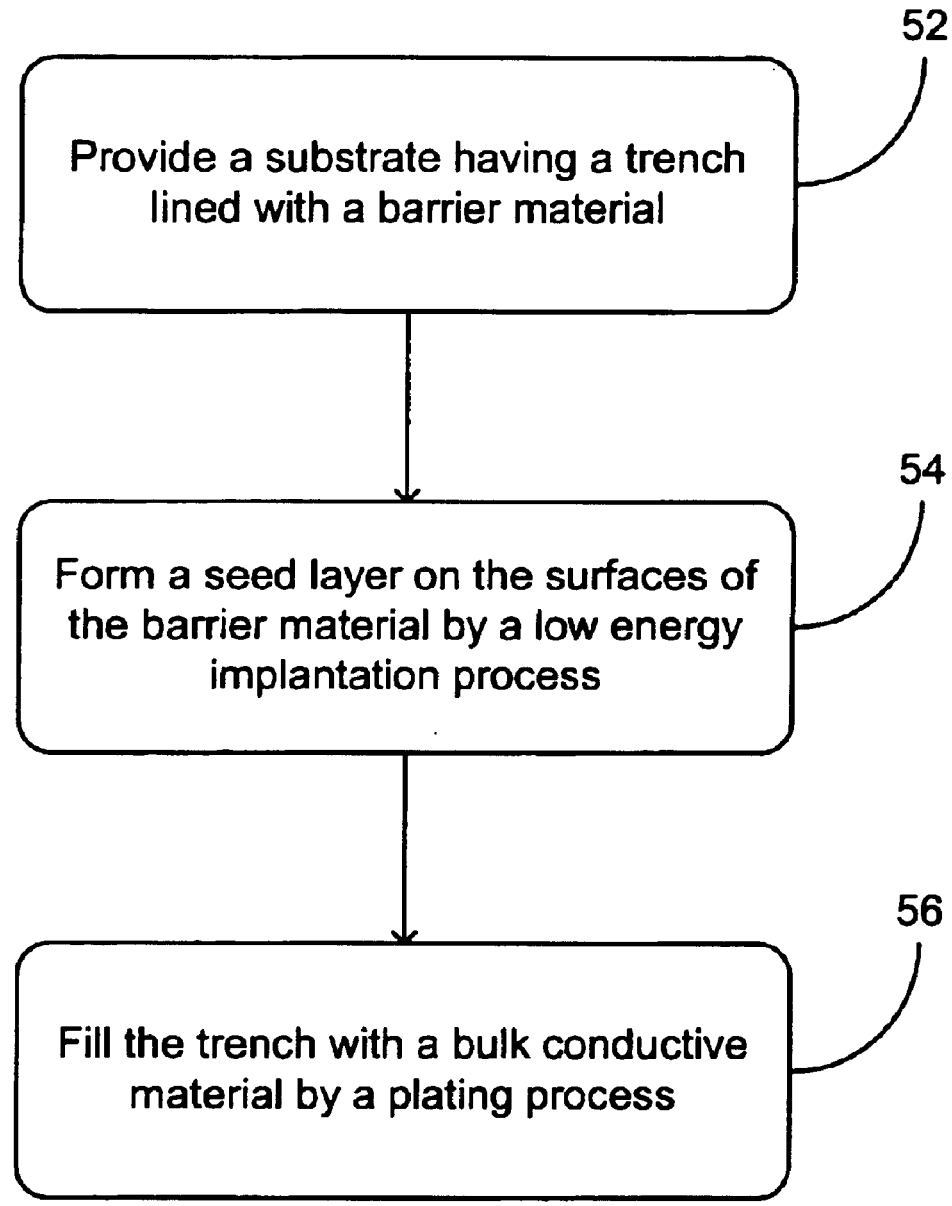
FIG. 5 is a process flow diagram illustrating a process flow encompassing the preferred embodiment and other embodiments of the invention.

FIG. 5 shows a process flow encompassing the preferred embodiment of FIGS. 4a–4d as well as the aforementioned alternative embodiments and other alternative embodiments not specifically discussed here. Initially, a substrate comprising an interlevel dielectric having a trench formed therein is provided (52). The trench may be a single damascene wiring trench, a dual damascene wiring trench, or a via. The trench is lined with a barrier material, which may be provided as a distinct layer or may comprise a portion of the interlevel dielectric at the trench wall surfaces that has been doped with one or more diffusion-preventing material. The substrate is then subjected to a low energy ion implantation process to form a seed layer of a conductive material on the barrier layer (54). The seed material is preferably copper. The low energy implantation process typically involves implanting seed material at an angle to the surface of the substrate while rotating the substrate continuously or among several stationary positions to achieve approximately even coverage of the trench sidewalls and bottom surface. Temperature control may also be applied to optimize seed layer growth. A plating process is then performed (56) to deposit a bulk conductive material in the trench. Further processing such as removal of an overburden portion of the conductor and formation of a passivation layer may then be performed.

It will be apparent to those having ordinary skill in the art that the tasks described in the above processes are not necessarily exclusive of other tasks, but rather that further tasks may be incorporated into the above processes in accordance with the particular structures or materials to be formed. For example, the layer of metal formed over the substrate may include any metal or its alloys for which a seed layer is used to enhance the effectiveness of formation of the metal by a plating process. Additionally, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope and spirit of the appended claims.

What is claimed is:

1. A method of fabricating an integrated circuit, comprising:

providing a substrate having a trench formed therein, at least the surfaces of the trench being composed of a diffusion barrier material;

forming a seed layer on the surfaces of the barrier material within the trench by a low energy ion implantation process while rotating said substrate continuously for a period of time during said ion implantation process; and filling the trench with a bulk conductive material by a plating process.

2. The method claimed in claim 1, wherein an implantation energy of said ion implantation process is chosen to prevent penetration of implanted ions through said barrier material.

3. The method claimed in claim 1, wherein said seed layer is formed to a thickness sufficient to avoid etching through by a plating solution during said plating process.

4. The method claimed in claim 1, wherein said ion implantation process is performed at a non-perpendicular angle to the broad surface of the substrate.

5. The method claimed in claim 1, wherein said seed layer comprises copper and said bulk conductive material comprises copper.

6. The method claimed in claim 1, further comprising:

removing an overburden portion of said bulk conductive material to leave an inlaid conductive element in said trench; and forming a passivation layer over at least an exposed surface of said inlaid conductive element.

7. The method claimed in claim 1, wherein the thickness of said seed layer has substantially equal thicknesses on bottom and sidewall surfaces of the trench.

8. The method claimed in claim 1, wherein the trench is a dual damascene trench.

9. The method claimed in claim 1, wherein the trench is a via.

10. A wiring element formed in accordance with the fabricating method claimed in claim 1.

11. A method of fabricating an integrated circuit, comprising:

providing a substrate having a trench formed therein, at least the surfaces of the trench being composed of a barrier material for preventing diffusion of copper;

forming a copper seed layer on the surfaces of the barrier material within the trench by low energy implantation of copper ions while rotating said substrate continuously for a period of time during said implantation; and filling the trench with a bulk copper material by a plating process, wherein an implantation energy of said implantation is chosen to prevent penetration of implanted copper ions through said barrier material, and wherein said seed layer is formed to a thickness sufficient to avoid etching through by a plating solution during said plating process.

12. The method claimed in claim 11, wherein said implantation is performed at a non-perpendicular angle to the broad surface of the substrate.

13. The method claimed in claim 11, wherein the trench is a dual damascene trench.

14. A wiring element formed in accordance with the fabricating method claimed in claim 11.

15. A method of fabricating an integrated circuit, comprising:

providing a substrate having a trench formed therein, at least the surfaces of the trench being composed of a diffusion barrier material;

forming a seed layer on the surfaces of the barrier material within the trench by a low energy ion implantation process at an angle to a broad surface of the substrate while rotating the substrate for a period of time during the implantation process; and filling the trench with a bulk conductive material by a plating process.

16. The method claimed in claim 15, wherein said seed layer comprises copper and said bulk conductive material comprises copper.

17. The method claimed in claim 15, further comprising:

removing an overburden portion of said bulk conductive material to leave an inlaid conductive element in said trench; and forming a passivation layer over at least an exposed surface of said inlaid conductive element.

18. A wiring element formed in accordance with the fabricating method claimed in claim 15.

19. A method of fabricating an integrated circuit, comprising:

providing a substrate having a trench formed therein, at least the surfaces of the trench being composed of a diffusion barrier material;

forming a seed layer on the surfaces of the barrier material within the trench by a low energy ion implantation process while rotating said substrate among a plurality of stationary positions during said ion implantation process; and filling the trench with a bulk conductive material by a plating process.

20. The method claimed in claim 19, wherein an implantation energy of said ion implantation process is chosen to prevent penetration of implanted ions through said barrier material.

21. The method claimed in claim 19, wherein said seed layer is formed to a thickness sufficient to avoid etching through by a plating solution during said plating process.

22. The method claimed in claim 19, wherein said ion implantation process is performed at a non-perpendicular angle to the broad surface of the substrate.

23. The method claimed in claim 19, wherein said seed layer comprises copper and said bulk conductive material comprises copper.

24. The method claimed in claim 19, further comprising:

removing an overburden portion of said bulk conductive material to leave an inlaid conductive element in said trench; and forming a passivation layer over at least an exposed surface of said inlaid conductive element.

25. The method claimed in claim 19, wherein the thickness of said seed layer has substantially equal thicknesses on bottom and sidewall surfaces of the trench.

26. The method claimed in claim 19, wherein the trench is a dual damascene trench.

27. The method claimed in claim 19, wherein the trench is a via.

28. A wiring element formed in accordance with the fabricating method claimed in claim 19.

29. A method of fabricating an integrated circuit, comprising:

providing a substrate having a trench formed therein, at least the surfaces of the trench being composed of a barrier material for preventing diffusion of copper;

forming a copper seed layer on the surfaces of the barrier material within the trench by low energy implantation of copper ions while rotating said substrate among a plurality of stationary positions during said implantation; and filling the trench with a bulk copper material by a plating process, wherein an implantation energy of said implantation is chosen to prevent penetration of implanted copper ions through said barrier layer, and wherein said seed layer is formed to a thickness sufficient to avoid etching through by a plating solution during said plating process.

30. The method claimed in claim 29, wherein said implantation is performed at a non-perpendicular angle to the broad surface of the substrate.

31. The method claimed in claim 29, wherein the trench is a dual damascene trench.

32. A wiring element formed in accordance with the fabricating method claimed in claim 29.

33. The method claimed in claim 15, wherein said angle of implantation is a non-perpendicular angle to the broad surface of the substrate.

* * * * *